US011082646B2

(12) United States Patent
Tsunai

(10) Patent No.: US 11,082,646 B2
(45) Date of Patent: *Aug. 3, 2021

(54) IMAGING UNIT, IMAGING APPARATUS, AND COMPUTER READABLE MEDIUM STORING THEREON AN IMAGING CONTROL PROGRAM

(71) Applicant: NIKON CORPORATION, Tokyo (JP)

(72) Inventor: Shiro Tsunai, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/844,231

(22) Filed: Apr. 9, 2020

(65) Prior Publication Data

US 2020/0236307 A1    Jul. 23, 2020

Related U.S. Application Data

(63) Continuation of application No. 15/946,168, filed on Apr. 5, 2018, now Pat. No. 10,652,485, which is a
(Continued)

(30) Foreign Application Priority Data

Mar. 30, 2012  (JP) ................................ 2012-082312
Jun. 5, 2012   (JP) ................................ 2012-128092

(51) Int. Cl.
*H04N 5/355*     (2011.01)
*H01L 27/146*    (2006.01)
(Continued)

(52) U.S. Cl.
CPC ......... *H04N 5/355* (2013.01); *H01L 27/1464* (2013.01); *H01L 27/14621* (2013.01);
(Continued)

(58) Field of Classification Search
CPC ...... H04N 5/355; H04N 5/3535; H04N 5/379; H04N 5/378; H04N 5/35563; H04N 5/372;
(Continued)

(56) References Cited

U.S. PATENT DOCUMENTS 5,262,871 A  11/1993 Wilder et al.
5,452,004 A   9/1995 Roberts
(Continued)

FOREIGN PATENT DOCUMENTS

JP   S62-241467 A  10/1987
JP   S6489720 A     4/1989
(Continued)

OTHER PUBLICATIONS

Nov. 10, 2015 Extended Search Report in European Patent Application No. 13768038.5.
(Continued)

*Primary Examiner* — Twyler L Haskins
*Assistant Examiner* — Angel L Garces-Rivera
(74) *Attorney, Agent, or Firm* — Oliff PLC

(57) ABSTRACT

When the amplification ratio is low and strong incident light causes a large charge, the signal retrieved from regions where the incident light is weak is also weak, but when the amplification ratio is high in regions where the incident light is weak, the signal retrieved from regions where the incident light is strong becomes saturated. Therefore, the dynamic range of the imaging unit is narrow. Provided is an imaging unit comprising an imaging section that includes a first group having one or more pixels and a second group having one or more pixels different from those of the first group; and a control section that, while a single charge accumulation is performed in the first group, causes pixel signals to be output by performing charge accumulation in the second
(Continued)

group a number of times differing from a number of times charge accumulation is performed in the first group.

20 Claims, 10 Drawing Sheets

Related U.S. Application Data continuation of application No. 15/401,683, filed on Jan. 9, 2017, now Pat. No. 9,967,480, which is a continuation of application No. 14/500,030, filed on Sep. 29, 2014, now Pat. No. 9,571,767, which is a continuation of application No. PCT/JP2013/002148, filed on Mar. 28, 2013.

(51) Int. Cl.
*H04N 5/353* (2011.01)
*H04N 5/369* (2011.01)
*H04N 5/372* (2011.01)
*H04N 5/378* (2011.01)

(52) U.S. Cl.
CPC .. *H01L 27/14627* (2013.01); *H01L 27/14634* (2013.01); *H01L 27/14636* (2013.01); *H01L 27/14645* (2013.01); *H04N 5/3535* (2013.01); *H04N 5/35563* (2013.01); *H04N 5/372* (2013.01); *H04N 5/378* (2013.01); *H04N 5/379* (2018.08)

(58) Field of Classification Search
CPC ......... H01L 27/14621; H01L 27/14627; H01L 27/14636; H01L 27/14645; H01L 27/14634; H01L 27/1464
See application file for complete search history.

(56) References Cited

U.S. PATENT DOCUMENTS

| | | | |
|---|---|---|---|
| 5,543,838 A | 8/1996 | Hosier et al. | |
| 6,693,670 B1 | 2/2004 | Stark | |
| 7,045,835 B2 | 5/2006 | Layman et al. | |
| 7,969,492 B2 | 6/2011 | Ohyama et al. | |
| 8,345,108 B2 | 1/2013 | Kobayashi | |
| 8,508,639 B2 | 8/2013 | Mabuchi et al. | |
| 8,792,034 B2 | 7/2014 | Takahashi | |
| 9,571,767 B2 | 2/2017 | Tsunai | |
| 2006/0023109 A1 | 2/2006 | Mabuchi et al. | |
| 2007/0195182 A1* | 8/2007 | Ito ................. | H04N 5/23245 348/308 |
| 2008/0259181 A1 | 10/2008 | Yamashita et al. | |
| 2009/0059049 A1 | 3/2009 | Ohyama et al. | |
| 2010/0007780 A1 | 1/2010 | Nishihara | |
| 2010/0066897 A1 | 3/2010 | Miyanari | |
| 2010/0187401 A1 | 7/2010 | Kawahito | |
| 2011/0096216 A1 | 4/2011 | Kawai et al. | |
| 2011/0310271 A1 | 12/2011 | Yamashita et al. | |
| 2011/0317032 A1 | 12/2011 | Yamashita et al. | |
| 2012/0057056 A1 | 3/2012 | Oike | |

FOREIGN PATENT DOCUMENTS

| | | |
|---|---|---|
| JP | H06-113195 A | 4/1994 |
| JP | H08-125924 A | 5/1996 |
| JP | 2001-103379 A | 4/2001 |
| JP | 2001-339057 A | 12/2001 |
| JP | 2006-049361 A | 2/2006 |
| JP | 2006-197192 A | 7/2006 |
| JP | 2007-184814 A | 7/2007 |
| JP | 2007-214832 A | 8/2007 |
| JP | 2007-220866 A | 8/2007 |
| JP | 2007-228460 A | 9/2007 |
| JP | 2007-318812 A | 12/2007 |
| JP | 2008289120 A | 11/2008 |
| JP | 2009055540 A | 3/2009 |
| JP | 2010-136205 A | 6/2010 |
| JP | 2010-166304 A | 7/2010 |
| JP | 2011-244309 A | 12/2011 |
| JP | 2012-010074 A | 1/2012 |
| WO | 2006/129762 A1 | 12/2006 |
| WO | 2007083704 A1 | 7/2007 |
| WO | 2007/134473 A1 | 11/2007 |

OTHER PUBLICATIONS

Sep. 23, 2016 Office Action issued in European Patent Application No. 13768038.5.
May 14, 2013 International Search Report issued in International Application No. PCT/JP2013/002148.
Oct. 9, 2014 International Preliminary Report on Patentability issued in International Application No. PCT/JP2013/002148.
Mar. 30, 2017 Office Action issued in Russian Patent Application No. 2014143824/07(070749).
Mar. 30, 2017 Office Action issued in Chinese Patent Application No. 201380018222.X.
May 30, 2017 Office Action issued in Japanese Patent Application No. 2014-507447.
Sep. 21, 2017 Office Action issued in European Patent Application No. 13768038.5.
Feb. 5, 2018 Office Action issued in Chinese Patent Application No. 201380018222.X.
Jan. 29, 2019 Office Action issued in Japanese Patent Application No. 2018-006805.
Jan. 29, 2019 Office Action issued in Japanese Patent Application No. 2018-006807.
Jan. 29, 2019 Office Action issued in Japanese Patent Application No. 2018-006808.
Feb. 15, 2019 Office Action issued in European Patent Application No. 19151551.9.
Aug. 30, 2019 Office Action issued in Indian Patent Application No. 8060/DELNP/2014.
Apr. 6, 2016 Office Action issued in U.S. Appl. No. 14/500,030.
Feb. 16, 2016 Office Action issued in U.S. Appl. No. 14/500,030.
Sep. 30, 2016 Notice of Allowance issued in U.S. Appl. No. 14/500,030.
Jun. 29, 2017 Office Action issued in U.S. Appl. No. 15/401,683.
Mar. 16, 2018 Notice of Allowability issued in U.S. Appl. No. 15/401,683.
Jan. 11, 2018 Notice of Allowance issued in U.S. Appl. No. 15/401,683.
Jul. 5, 2019 Office Action issued in U.S. Appl. No. 15/946,168.
Jan. 10, 2020 Notice of Allowance issued in U.S. Appl. No. 15/946,168.
Nov. 24, 2020 Office Action issued in Japanese Patent Application No. 2019-175860.
Dec. 17, 2020 Office Action issued in Chinese Patent Application No. 201910490295.8.
Dec. 3, 2020 Office Action issued in Chinese Patent Application No. 201910490680.2.

* cited by examiner

| INDEX NUMBER | NUMBER OF CALCULATIONS | D RANGE UP |
|---|---|---|
| 000 | 1 TIME | 0 |
| 001 | 2 TIMES | 1 STAGE |
| 010 | 4 TIMES | 2 STAGES |
| ... | ... | ... |
| 111 | 128 TIMES | 7 STAGES |

IMAGING UNIT, IMAGING APPARATUS, AND COMPUTER READABLE MEDIUM STORING THEREON AN IMAGING CONTROL PROGRAM

This is a Continuation of U.S. application Ser. No. 15/946,168 filed Apr. 5, 2018, which is a Continuation of U.S. application Ser. No. 15/401,683 filed Jan. 9, 2017, which is a Continuation of U.S. application Ser. No. 14/500,030 filed Sep. 29, 2014, which is a Continuation of International Application No. PCT/JP2013/002148 filed Mar. 28, 2013, which claims the benefit of Japanese Application No. 2012-128092 filed Jun. 5, 2012 and Japanese Application No. 2012-082312 filed Mar. 30, 2012. The disclosures of the prior applications are hereby incorporated by reference herein in their entireties.

BACKGROUND

1. Technical Field

The present invention relates to an imaging unit, an imaging apparatus, and a computer readable medium storing thereon an imaging control program.

2. Related Art

An imaging unit is known in which a back emission type imaging chip and a signal processing chip are connected via micro-bumps provided for each cell containing a group of pixels.
Patent Document 1: Japanese Patent Application Publication No. 2006-49361

When the amplification ratio is low in a case where the incident light is strong and there is a large amount of charge, the signal retrieved from the regions where the incident light is weak is also weak. On the other hand, when the amplification ratio is high in regions where the incident light is weak, the signal retrieved from regions where the incident light is strong becomes saturated. Therefore, the dynamic range of the imaging unit is limited to a narrow range.

SUMMARY

According to a first aspect of the present invention, provided is an imaging unit comprising an imaging section that includes a first group having one or more pixels and a second group having one or more pixels that are different from the one or more pixels of the first group; and a control section that, while a single charge accumulation is being performed in the first group, causes respective pixel signals to be output by performing charge accumulation in the second group a number of times differing from a number of times charge accumulation is performed in the first group.

According to a second aspect of the present invention, provided is an imaging apparatus including the imaging unit described above.

According to a third aspect of the present invention, provided is an imaging control program that, when executed, causes a computer to perform first initiation of beginning charge accumulation in a first group including one or more pixels; second initiation of beginning charge accumulation in a second group including one or more pixels, which are different from the pixels of the first group; second output of, before or at the moment when the charge accumulation in the first group ends, ending the charge accumulation in the second group and outputting a pixel signal; and first output of, after repeating the second initiation and the second output a plurality of times, ending the charge accumulation in the first group and outputting a pixel signal.

According to a fourth aspect of the present invention, provided is an imaging apparatus comprising an imaging section including a first group having one or more pixels and a second group having one or more pixels that are different from the one or more pixels of the first group; a control section that, while a plurality of charge accumulations are being performed in the first group, causes respective pixel signals to be output by performing a plurality of charge accumulations in the second group; and a calculating section that performs computation such that a process applied to the pixel signals output from the first group differs from a process applied to the pixel signals output from the second group.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
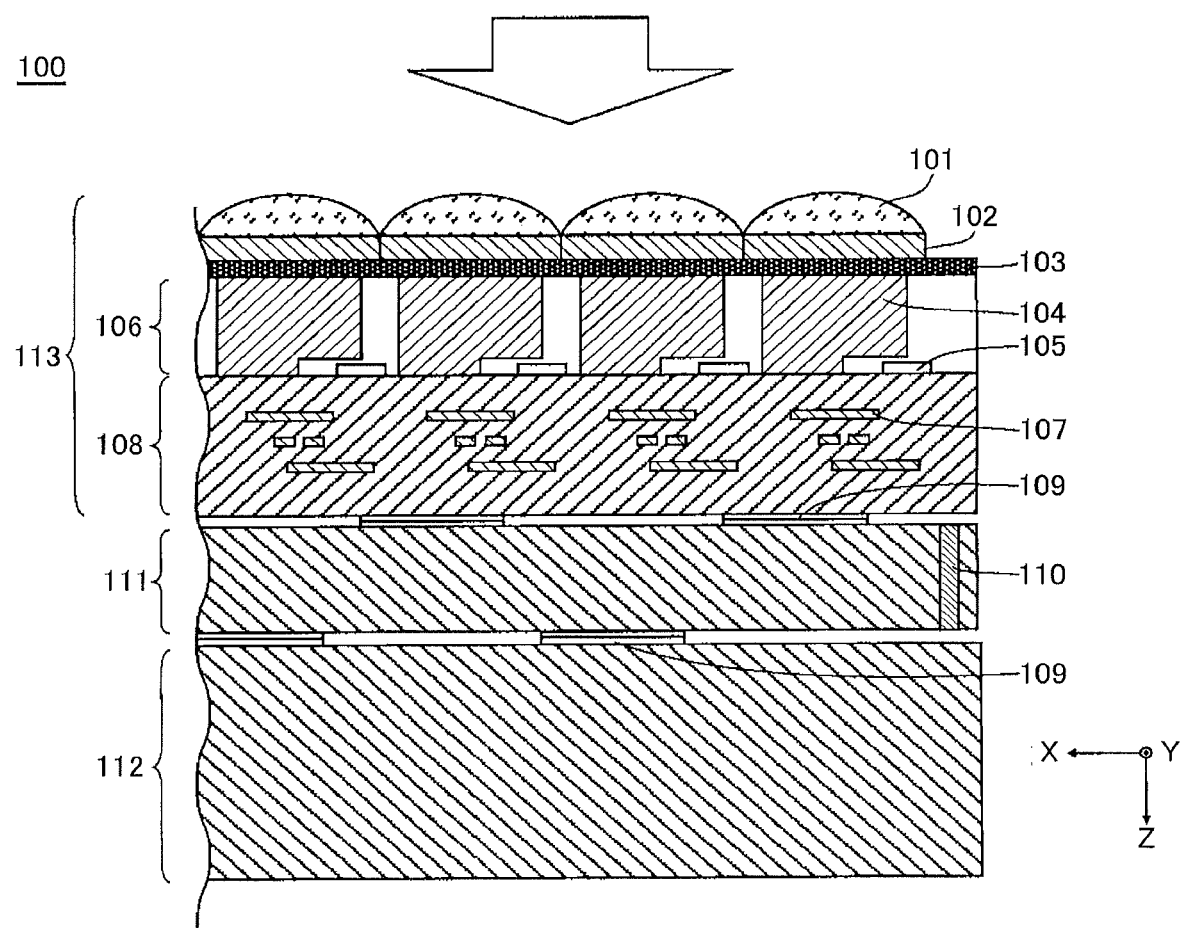
FIG. 1 is a cross-sectional view of a back emission image MOS capturing element according to an embodiment of the present invention.

FIG. 1 is a cross-sectional view of a back emission imaging element 100 according to an embodiment of the present invention. The imaging element 100 includes an imaging chip 113 that outputs a pixel signal corresponding to incident light, a signal processing chip 111 that processes the pixel signal, and a memory chip 112 that records the pixel signals. The imaging chip 113, the signal processing chip 111, and the memory chip 112 are layered, and are electrically connected to each other by conductive bumps 109 made of Cu, for example.

As shown in the drawings, the incident light is mainly incident in the positive Z-axis direction, as shown by the hollow white arrow. In the present embodiment, the surface of the imaging chip 113 to which the incident light is incident is referred to as the back surface. Furthermore, as shown by the axes, the direction to the left in the plane of the drawing and orthogonal to the Z axis is the positive X-axis direction, and the direction coming forward from the plane of the drawing and orthogonal to the X axis and Z axis is the positive Y-axis direction. In many of the following drawings, the coordinate axes of FIG. 1 are used as a reference, and these coordinate axes are included in the drawings to indicate the orientation.

The imaging chip 113 is a back emission MOS image sensor, for example. The PD layer 106 is arranged on the back surface side of the wiring layer 108. The PD layer 106 includes a plurality of PDs (photodiodes) 104 arranged two-dimensionally, and transistors 105 provided corresponding to the PDs 104.

Color filters 102 are provided on the incident light side of the PD layers 106, with a passivation film 103 arranged therebetween. The color filters 102 include a plurality of types that pass different wavelength regions, and have a prescribed arrangement corresponding respectively to the PDs 104. The arrangement of the color filters 102 is described further below. Each set of a color filter 102, a PD 104, and a transistor 105 forms one pixel.

Microlenses 101 are arranged on the incident light side of the color filter 102, corresponding respectively to the pixels. The microlenses 101 each gather the incident light toward the corresponding PD 104.

The wiring layer 108 includes wires 107 that transmit the pixel signals from the PD layer 106 to the signal processing chip 111. The wire 107 may be multilayer, and may include active elements and passive elements.

A plurality of bumps 109 are arranged on the front surface of the wiring layer 108. These bumps 109 are aligned with a plurality of bumps 109 on the surface facing the signal processing chip 111, and the aligned bumps 109 are connected to each other to form an electrical connection, by pressing the imaging chip 113 and the signal processing chip 111 together, for example.

In the same manner, a plurality of bumps 109 are arranged on the surfaces of the signal processing chip 111 and the memory chip 112 facing each other. The These bumps 109 are aligned with each other and the aligned bumps 109 are connected to each other to form an electrical connection, by pressing the signal processing chip 111 and the memory chip 112 together, for example.

The connection between the bumps 109 is not limited to a Cu bump connection through solid phase diffusion, and a micro-bump connection through solder fusion may be adopted instead. Furthermore, approximately 1 bump 109 should be provided for each pixel group, for example, as described further below. Accordingly, the bumps 109 may be larger than the pitch of the PDs 104. Furthermore, in the peripheral region outside of the pixel regions where the pixels are arranged, bumps that are larger than the bumps 109 corresponding to the pixel regions may be provided.

The signal processing chip 111 includes a TSV (Through Silicon Via) 110 that connects each of the circuits provided on the front and back surfaces. The TSV 110 is preferably provided in the peripheral region. Furthermore, the TSV 110 may be provided both in the peripheral region of the imaging chip 113 and the memory chip 112.

Figure 2:
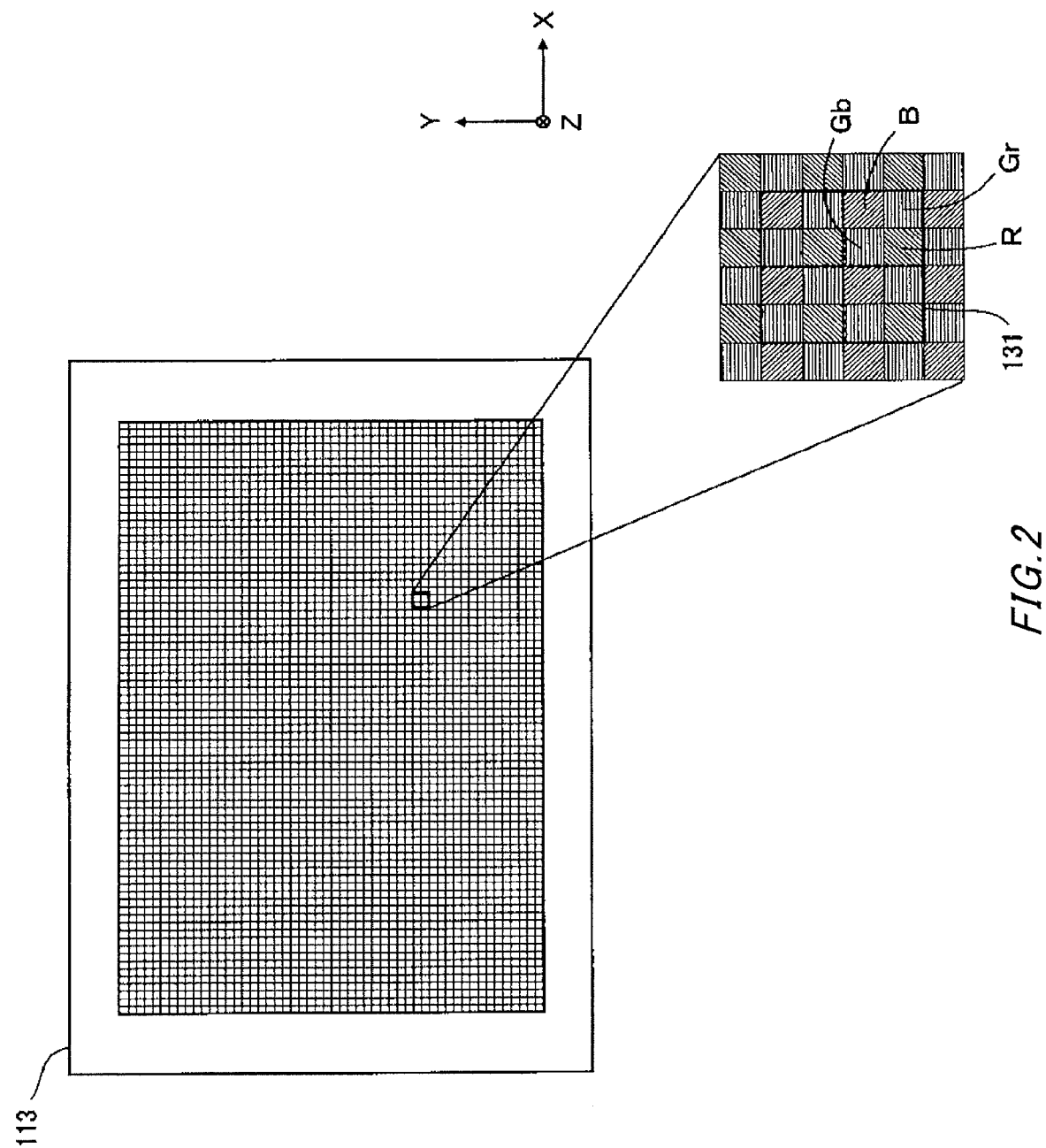
FIG. 2 is a view for describing the single group and the pixel arrangement of the imaging chip.

FIG. 2 is a view for describing the single group 131 and the pixel arrangement of the imaging chip 113. In particular, the imaging chip 113 is shown as seen from the back surface side. Twenty million or more pixels are arranged in the pixel region in a matrix formation. In the present embodiment, 16 pixels in a 4×4 arrangement of adjacent pixels form one group. The grid lines in the drawing indicate single groups 131 formed by grouping adjacent pixels.

As shown in the enlarged view of a portion of the pixel region, a single group 131 has a so-called Bayer arrangement in which green pixels Gb and Gr, a blue pixel B, and a red pixel R are arranged in respective corners. The green pixels are pixels that have green filters as the color filters 102, and receive light in the green wavelength band within the incident light. Similarly, the blue pixel is a pixel that has a blue filter as the color filter 102 and receives light in the blue wavelength band, and the red pixel is a pixel that has a red filter as the color filter 102 and receives light in the red wavelength band.

Figure 3:
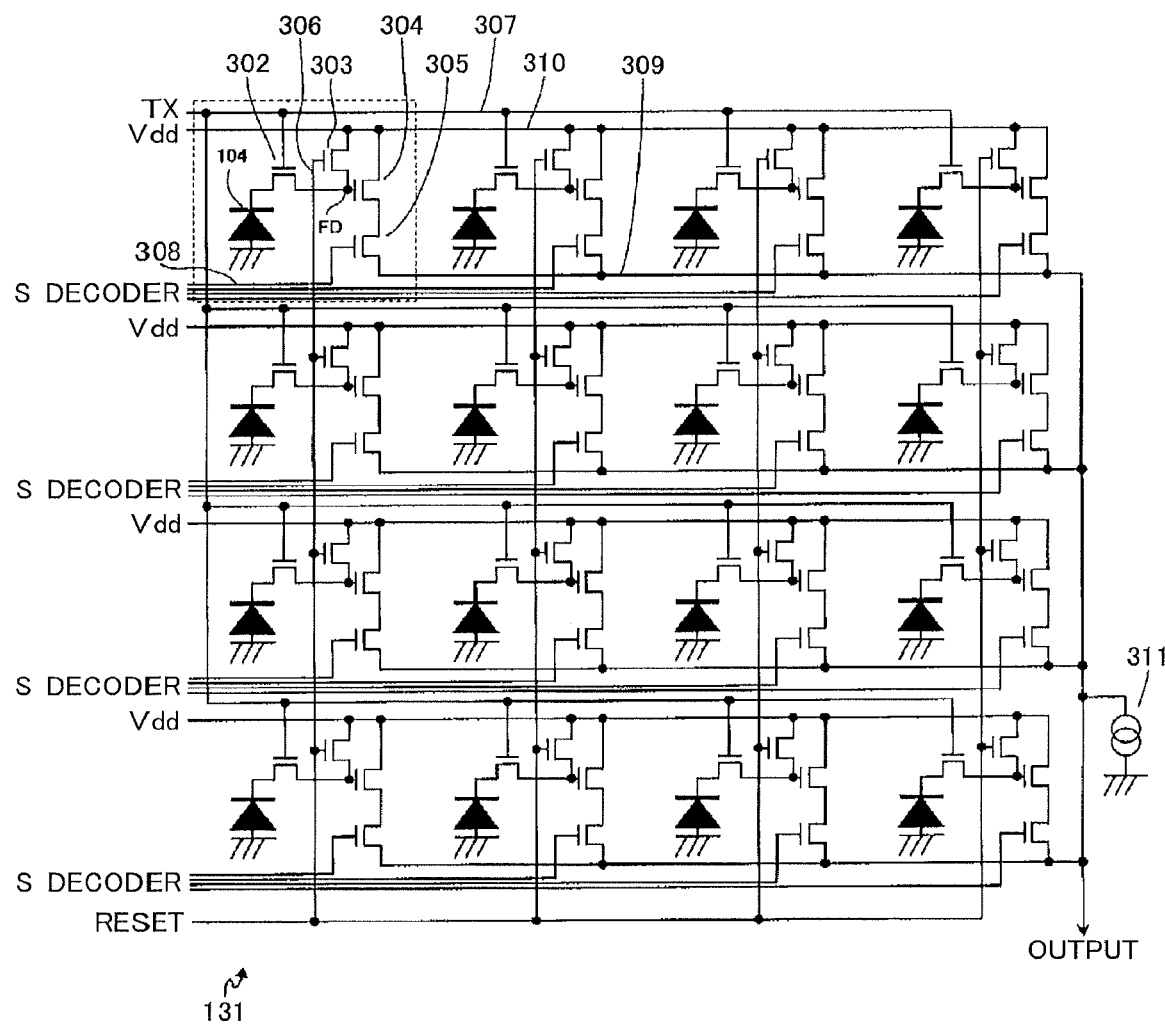
FIG. 3 is a circuit diagram corresponding to a single group of the imaging chip.

FIG. 3 is a circuit diagram corresponding to a single group 131 of the imaging chip 113. In the drawing, the rectangle surrounded by the dotted line is representative of a circuit corresponding to one pixel. At least some of the transistors in the following description correspond to the transistor 105 shown in FIG. 1.

As described above, the single group 131 is formed from 16 pixels. The 16 PDs 104 corresponding respectively to the pixels are each connected to the transfer transistor 302, and a TX wire 307 that supplies a transfer pulse is connected to each gate of each transfer transistor 302. In the present embodiment, the TX wire 307 is connected in a manner to be shared by 16 transfer transistors 302.

The drain of each transfer transistor 302 is connected to the source of the corresponding reset transistor 303, and a so-called floating diffusion FD between the drain of each transfer transistor 302 and the source of the corresponding reset transistor 303 is connected to the gate of the corresponding amplification transistor 304. The drain of the reset transistor 303 is connected to the Vdd wire 310 that is supplied with the power supply voltage, and the gate of the reset transistor 303 is connected to the reset wire 306 that is supplied with a reset pulse. In the present embodiment, the reset wire 306 is connected in a manner to be shared by 16 reset transistors 303.

The drain of each amplification transistor 304 is connected to the Vdd wire 310 that is supplied with the power supply voltage. The source of each amplification transistor 304 is connected to the drain of the corresponding selection transistor 305. Each gate of a selection transistor is connected to the decoder wire 308 that is supplied with a connection pulse. In the present embodiment, the decoder wire 308 is provided independently for each set of 16 selection transistors 305. The source of each selection transistor 305 is connected to a common output wire 309. The negative current source 311 supplies current to the output wire 309. In other words, the output wire 309 for a selection transistor 305 is formed by a source follower. The negative current source 311 may be provided on the imaging chip 113 side, or on the signal processing chip 111 side.

The following describes the flow from the start of charge accumulation to the pixel output after ending the accumulation. The reset pulse is applied to the reset transistor 303 through the reset wire 306, and at the same time the transfer pulse is applied to the transfer transistor 302 through the TX wire 307, thereby resetting the potentials of the PD 104 and the floating diffusion FD.

When the application of the transfer pulse ends, the PD 104 converts the received incident light into charge and accumulates this charge. After this, when the transfer pulse is again applied in a state where the reset pulse is not being applied, the accumulated charge is transferred to the floating diffusion FD, and the potential of the floating diffusion FD changes from the reset potential to a signal potential after charge accumulation. When the selection pulse is applied to the selection transistor 305 through the decoder wire 308, the change of the signal potential of the floating diffusion FD is communicated to the output wire 309 through the amplification transistor 304 and the selection transistor 305. In this way, the pixel signal corresponding to the reset potential and the signal potential is output to the output wire 309 from the single pixel.

As shown in the drawings, in the present embodiment, the reset wire 306 and the TX wire 307 are shared by 16 pixels forming a single group 131. In other words, each reset pulse and transfer pulse is applied simultaneously to all 16 pixels. Accordingly, all of the pixels forming a single group 131 begin accumulating charge at the same timing, and finish accumulating charge at the same timing. However, the pixel signals corresponding to the accumulated charges are selectively output to the output wire 309 as a result of the respective selection transistors 305 sequentially applying selection pulses.

In this way, by configuring the circuit with single groups 131 as a standard, the charge accumulation time of each single group 131 can be controlled. In other words, adjacent single groups 131 can output respective pixel signals with different charge accumulation times. As yet another rephrasing, while one single group 131 is performing a single charge accumulation, another single group 131 can repeatedly perform any number of charge accumulations, and output a corresponding pixel signal. The specific output control is described below.

Figure 4:
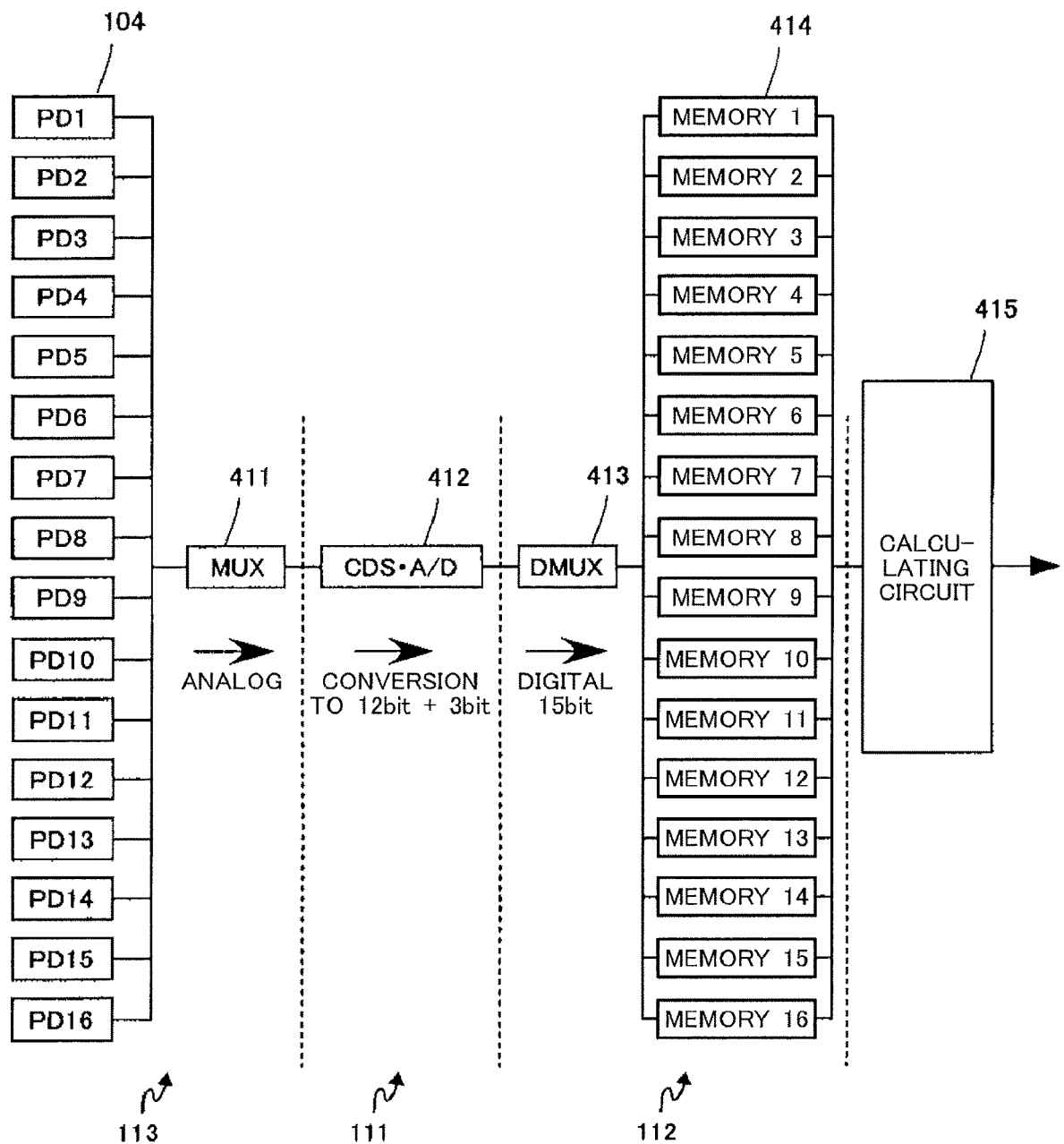
FIG. 4 is a block diagram showing a functional configuration of the imaging element.

FIG. 4 is a block diagram showing a functional configuration of the imaging element 100. The analog multiplexer 411 sequentially selects PDs 104 among the 16 PDs 104 forming the single group 131, and causes each PD 104 to output a pixel signal to the output wire 309. The multiplexer 411 is formed in the imaging chip 113 along with the PDs 104.

The pixel signal output via the multiplexer 411 undergoes CDS (Correlated Double Sampling) and an A/D (Analog/Digital) conversion by the signal processing circuit 412 that performs CDS and A/D conversions formed in the signal processing chip 111. The pixel signal resulting from the A/D conversion is handed over to the de-multiplexer 413, and stored in the pixel memory 414 corresponding to the pixel. Each pixel memory 414 has a capacity that enables storage of a number of pixel signals corresponding to a maximum number of integrations, which is described further below. The de-multiplexer 413 and the pixel memories 414 are formed in the memory chip 112.

The A/D conversion includes converting the input analog pixel signal into a 12-bit digital pixel signal. At the same time, the signal processing circuit 412 attaches a 3-bit index number corresponding to the number of integrations, which is described further below, and hands over the digital pixel signal having a total size of 15 bits to the de-multiplexer 413. Accordingly, the pixel memory 414 stores a 15-bit digital pixel signal corresponding to one charge accumulation.

The calculating circuit 415 processes the pixel signal stored in the pixel memory 414, and hands the resulting signal over to the image processing section provided at a later stage. The calculating circuit 415 may be provided in the signal processing chip 111, or may be provided in the memory chip 112. The drawings show the connection to one group, but a calculating circuit 415 is actually provided for each group, and the calculating circuits 415 operate in parallel. It should be noted that a calculating circuit 415 need not be provided for each group, and instead a single calculating circuit 415 may perform sequential processing while sequentially referencing the values in the pixel memories 414 corresponding to respective groups, for example.

Figure 5:
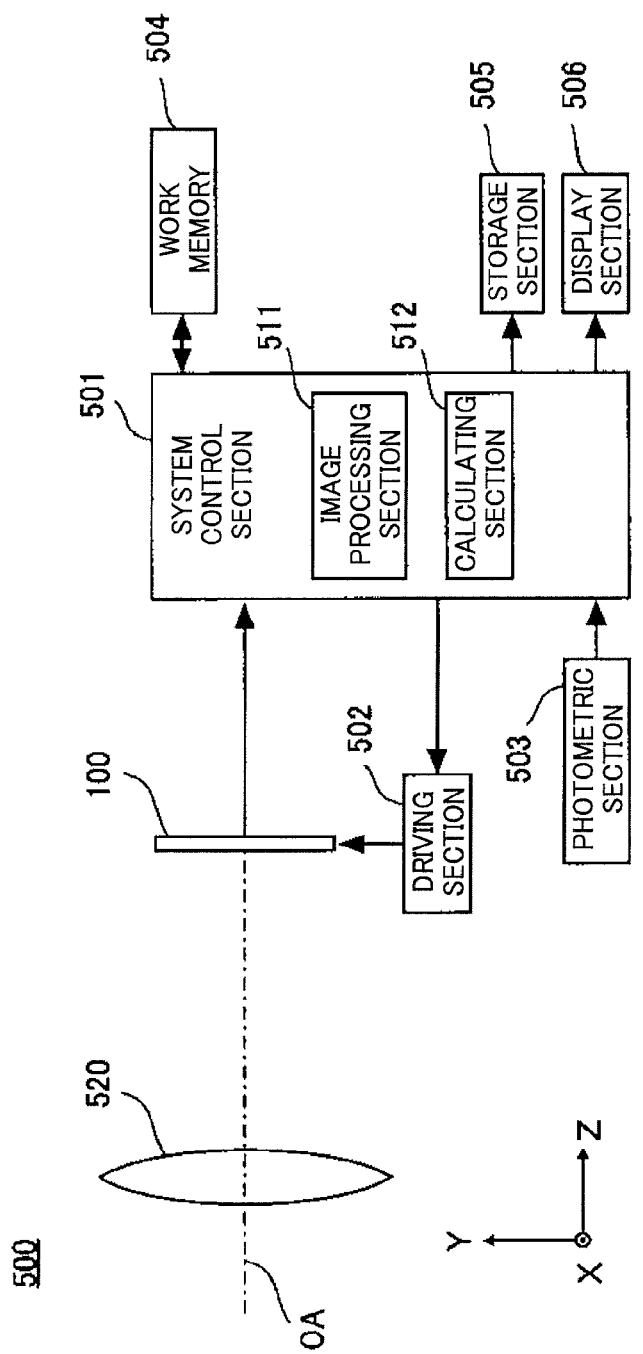
FIG. 5 is a block diagram showing a configuration of the imaging apparatus according to the present embodiment.

FIG. 5 is a block diagram showing a configuration of the imaging apparatus according to the present embodiment. The imaging apparatus 500 includes an imaging lens 520 serving as an imaging optical system, and the imaging lens 520 guides subject light that is incident along the optical axis OA to the imaging element 100. The imaging lens 520 may be an exchangeable lens that can be attached to and detached from the imaging apparatus 500. The imaging apparatus 500 primarily includes the imaging element 100, a system control section 501, a driving section 502, a photometric section 503, a work memory 504, a storage section 505, and a display section 506.

The imaging lens 520 is formed by a plurality of optical lens groups, and focuses the subject light from a scene near a focal plane. In FIG. 1, the imaging lens 520 is represented by a single virtual lens arranged near the pupil. The driving section 502 is a control circuit that performs charge accumulation control such as region control and timing control of the imaging element 100, according to instructions from the system control section 501. In this sense, the driving section 502 can be said to have the function of an imaging element control section that causes the pixel signals to be output by performing charge accumulation for the imaging element 100. The driving section 502 forms an imaging unit when combined with the imaging element 100. The control circuit forming the driving section 502 may be formed as a chip and layered on the imaging element 100.

The imaging element 100 hands the pixel signal over to the image processing section 511 of the system control section 501. The image processing section 511 applies various types of image processing, with the work memory 504 as a work space, to form image data. For example, when generating image data in a JPEG file format, the image processing section 511 performs a white balance process, a gamma process, and the like, and then performs a compression process. The generated image data is recorded in the storage section 505, and is converted to a display signal to be displayed in the display section 506 during a predetermined time.

The photometric section 503 detects the brightness distribution of a scene before the imaging sequence for generating the image data. The photometric section 503 includes an AE sensor with approximately 1 million pixels, for example. The calculating section 512 of the system control section 501 receives the output of the photometric section 503 and calculates the brightness of each region of the system control section 501. The calculating section 512 determines the shutter speed, diaphragm value, and ISO sensitivity according to the calculated brightness distribution. In the present embodiment, the calculating section 512 further determines how many times the charge accumulation is repeated in each pixel group region of the imaging chip 113, until the determined shutter speed is reached. The calculating section 512 performs a variety of calculations for operating the imaging apparatus 500.

Figure 6A:
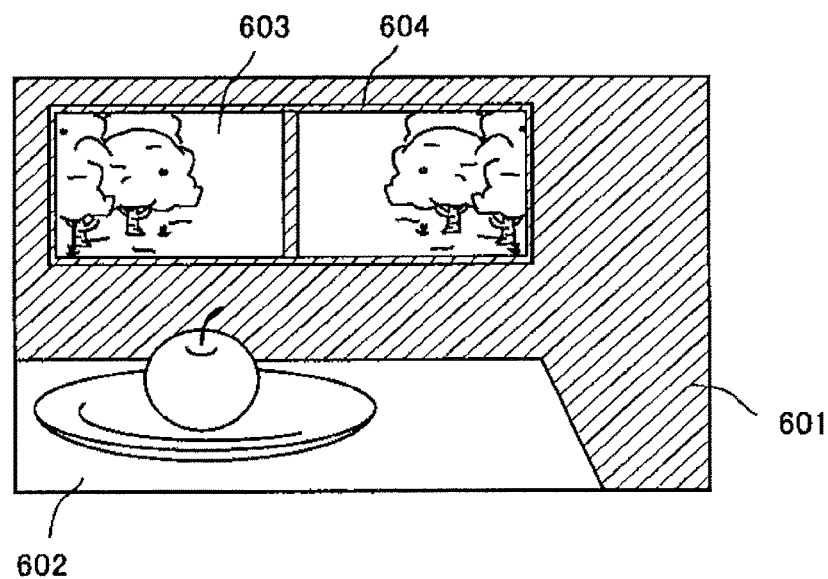
FIGS. 6A and 6B are view for describing an exemplary scene and region allocation.
Figure 6B:
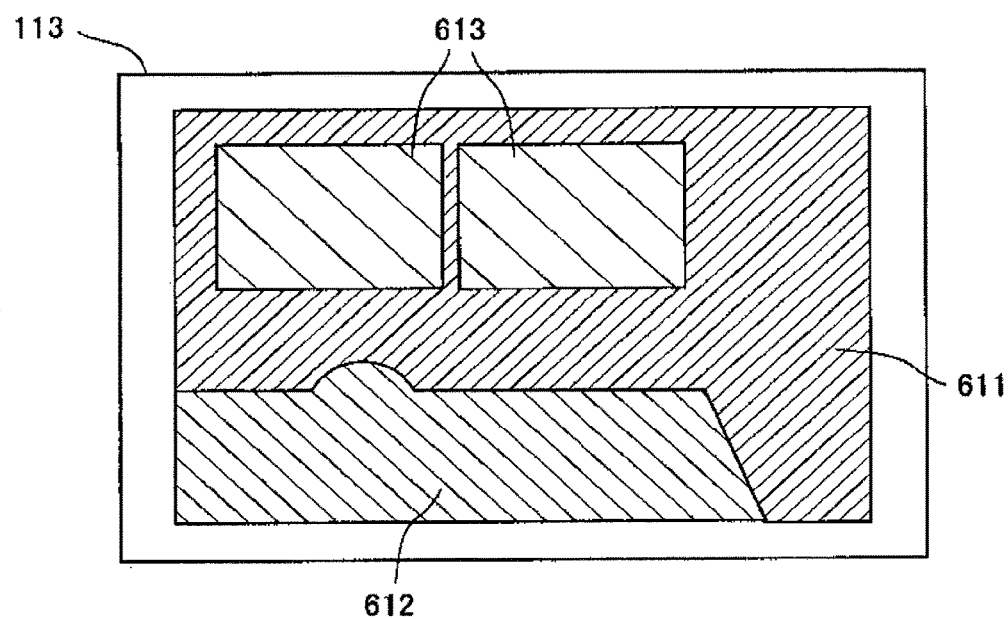

FIGS. 6A and 6B are views for describing an exemplary scene and region allocation. FIG. 6A shows a scene captured by pixel regions of the imaging chip 113. Specifically, the scene includes an intermediate subject 602 and a shadowed subject 601 included in the room environment and a highlighted subject 603 of the outdoor environment seen within the frame 604. In this way, when capturing an image of a scene in which there is a large brightness difference from the highlight portion to the shadow portion, if a conventional imaging element is used, underexposure occurs in the shadow portion if charge accumulation is performed with the highlight portion as the standard, and overexposure occurs in the highlight portion if charge accumulation is performed with the shadow portion as the standard. In other words, the dynamic range of the photodiodes for a scene with a large brightness difference is insufficient to output an image signal in which charge accumulation is uniform for both the highlight portion and the shadow portion. Therefore, in the present invention, the dynamic range is substantially enlarged by dividing the scene into the partial regions of the highlight portion and the shadow portion, and creating differences in the number of charge accumulations of the photodiodes corresponding to the respective portions.

FIG. 6B shows the region division for the pixel region of the imaging chip 113. The calculating section 512 analyzes the scene of FIG. 6A captured by the photometric section 503, and divides the pixel region using brightness as a reference. For example, the system control section 501 performs scene acquisition a plurality of times while changing the exposure time for the photometric section 503, and the calculating section 512 determines the dividing lines of the pixel regions by referencing the change in the distribution of the overexposure region and the underexposure region. In the example of FIG. 6B, the calculating section 512 divides the scene into three regions, which are the shadow region 611, the intermediate region 612, and the highlight region 613.

The dividing lines are defined along the boundaries of the single groups 131. In other words, each of the divided regions includes an integer number of groups. Furthermore, the pixels of each group contained in the same region output the same number of pixel signals and perform charge accumulation the same number of times within the period corresponding to the shutter speed determined by the calculating section 512. If associated regions are different, the number of pixel signals output and the number of times charge accumulation is performed are different.

Figures 7, 8:
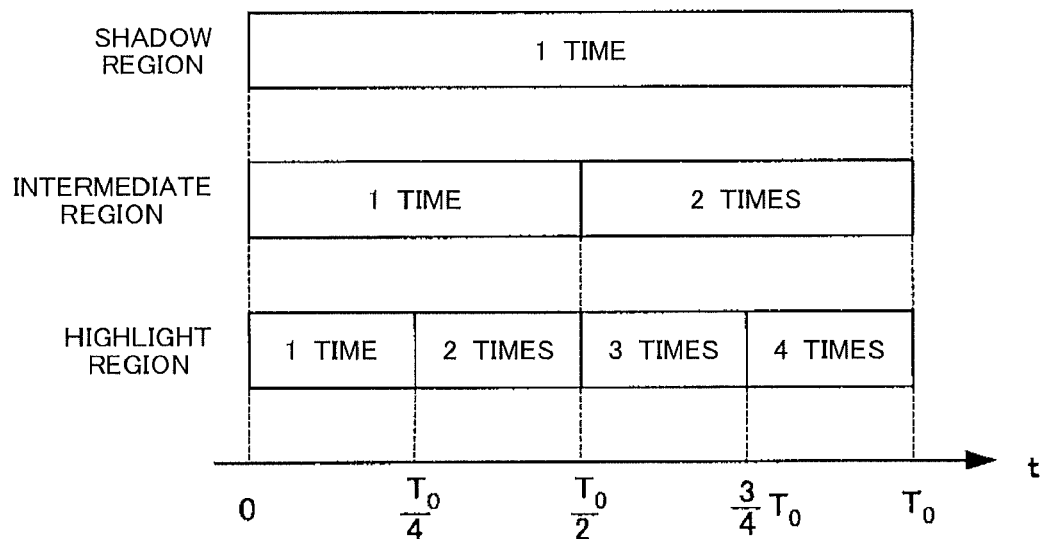
FIG. 7 is used to describe the charge accumulation in each divided region.
FIG. 8 shows the relationship between the number of integrations and the dynamic range.

FIG. 7 is used to describe the charge accumulation in each region divided as shown in FIGS. 6A and 6B. Upon receiving image capturing preparation instructions from the user, the calculating section 512 determines the shutter speed (exposure time) T0 from the output of the photometric section 503. Furthermore, the shadow region 611, the intermediate region 612, and the highlight region 613 are divided as described above, and the number of charge accumulations is determined from the brightness information of each region. The number of charge accumulations is determined such that pixel saturation does not occur from one charge accumulation. For example, the number of charge accumulations may be determined using a reference that is 80% to 90% of the charge that can be accumulated in a single charge accumulation operation.

Here, charge accumulation is performed once for the shadow region 611. In other words, the charge accumulation time matches the determined exposure time T0. Furthermore, the charge accumulation is performed twice for the intermediate region 612. In other words, the charge accumulation is performed twice during the exposure time T0, with each charge accumulation time being T0/2. Furthermore, the charge accumulation is performed four times for the highlight region 613. In other words, the charge accumulation is performed four times during the exposure time T0, with each charge accumulation time being T0/4.

Upon receiving image capturing instructions from the user at the time t=0, the driving section 502 applies a reset pulse and a transfer pulse to the pixels of the groups associated with one of the regions. The application of these pulses triggers the start of charge accumulation for one of the pixels.

At the time t=T0/4, the driving section 502 applies the transfer pulse to the pixels of the group associated with the highlight region 613. The driving section 502 sequentially applies selection pulses to the pixels within each group, to cause each of the pixel signals to be output to the output wire 309. When the pixel signals of all of the pixels in the group have been output, the driving section 502 again applies the reset pulse and the transfer pulse to the pixels of the group associated with the highlight region 613, to begin the second charge accumulation.

Since time is needed for the pixel signal selection output, there is a time difference between the end of the first charge accumulation and the start of the second charge accumulation. If this time difference is short enough to be substantially ignored, the time obtained by dividing the exposure time T0 by the number of charge accumulations should be set as the first charge accumulation time. On the other hand, if this time difference cannot be ignored, then the exposure time T0 should be adjusted in consideration of this time difference, such that the first charge accumulation time is shorter than the time obtained by dividing the exposure time T0 by the number of charge accumulations.

At the time t=T0/2, the driving section 502 applies the transfer pulse to the pixels of the groups associated with the intermediate region 612 and the highlight region 613. The driving section 502 then sequentially applies the selection pulses to the pixels in each of these groups, to cause the respective pixel signals to be output by the output wire 309. When the pixel signals of all of the pixels in these groups have been output, the driving section 502 again applies the reset pulse and the transfer pulse to the pixels in the groups associated with the intermediate region 612 and the highlight region 613, to begin the second charge accumulation for the intermediate region 612 and the third charge accumulation for the highlight region 613.

At the time t=3T0/4, the driving section 502 applies the transfer pulse to the pixels of the group associated with the highlight region 613. The driving section 502 sequentially applies selection pulses to the pixels within each group, to cause each of the pixel signals to be output to the output wire 309. When the pixel signals of all of the pixels in the group have been output, the driving section 502 again applies the reset pulse and the transfer pulse to the pixels of the group associated with the highlight region 613, to begin the fourth charge accumulation.

At the time t=T0, the driving section 502 applies the transfer pulse to the pixels in all regions. The driving section 502 sequentially applies the selection pulses to the pixels in each group, to cause each pixel signal to be output to the output wire 309. With the control described above, pixel signals from one charge accumulation are stored in the pixel memories 414 corresponding to the shadow region 611, pixel signals from two charge accumulations are stored in the pixel memories 414 corresponding to the intermediate region 612, and pixel signals from four charge accumulations are stored in the pixel memories 414 corresponding to the highlight region 613.

These pixel signals are transferred sequentially to the image processing section 511. The image processing section 511 generates image data with a high dynamic range from these pixel signals. The detailed processing is described further below.

FIG. 8 shows the relationship between the number of integrations and the dynamic range. The pixel signals from a plurality of charge accumulations performed repeatedly undergo computational processing by the image processing section 511 to form a portion of the image data with the high dynamic range.

When the number of integrations is 1, i.e. when the dynamic range of a region for which charge accumulation is performed once is used as a reference, the enlargement of the dynamic range of a region in which the number of integrations is 2, i.e. a region where the charge accumulation is performed twice and the output signals are integrated, is one stage. Similarly, the enlargement is two stages when the number of integrations is 4, and is 7 stages when the number of integrations is 128. In other words, in order to enlarge the dynamic range by n stages, the output signals should be integrated $2n$ times.

Here, in order to identify the number of times that the image processing section 511 has performed charge accumulation in each of the divided regions, the image signals are each provided with a 3-bit index number indicating the number of integrations. As shown in the drawings, the index numbers are allocated in a manner of 000 for one integration, 001 for two integrations, . . . , and 111 for 128 integrations.

The image processing section 511 references the index number of each pixel signal received from the calculating circuit 415, and if the result of this referencing is that the number of integrations is two or more, performs an integration process on the pixel signal. For example, when the number of integrations is two (one stage), for two pixel signals, the image processing section 511 adds the top 11 bits of the 12-bit pixel signal corresponding to the charge accumulation, thereby generating one 12-bit signal. In the same manner, when the number of integrations is 128 (seven stages), for 128 pixel signals, the image processing section 511 adds together the top 5 bits of the 12-bit pixel signal corresponding to the charge accumulation, thereby generating one 12-bit signal. In other words, a number of top bits equal to the number of stages corresponding to the number of integrations subtracted from 12 are added together, to generate one 12-bit pixel signal. The lower bits that are not used in the addition are deleted.

With this type of processing, it is possible to shift the brightness range having a gradation sequence to the high brightness side, in accordance with the number of integrations. In other words, 12 bits are allocated for a limited range on the high brightness side. Accordingly, the image regions that conventionally experienced overexposure can be provided with a gradation sequence.

However, since 12 bits are allocated to different brightness ranges in other divided regions, the image data cannot be generated simply by connecting all of the regions. Therefore, in order to maintain the achieved gradation sequence as much as possible while generating 12-bit image data for all of the regions, the image processing section 511 performs a requantization process using the pixel with highest brightness and the pixel with the lowest brightness as a reference. Specifically, the image processing section 511 performs quantization by applying a gamma conversion, in a manner to smooth the gradation sequence. By performing this process, the image data with a high dynamic range can be obtained.

The number of integrations is not limited to a case in which the pixel signals are provided with 3-bit index numbers as described above, and may be recorded in associated information other than the pixel signals. Furthermore, by omitting the index numbers from the pixel signals and instead counting the number of pixel signals stored in the pixel memory 414, the number of integrations may be obtained when performing the adding process.

In the image processing described above, the requantization process is performed such that all regions fall within the 12-bit image data, but the number of output bits may be increased according to the maximum number of integrations for the number of bits of the pixel signals. For example, if the maximum number of integrations is set to 16 (four stages), 16-bit image data for all of the regions may be used for the 12-bit pixel signals. With this processing, the image data can be generated without losing digits.

Figure 9:
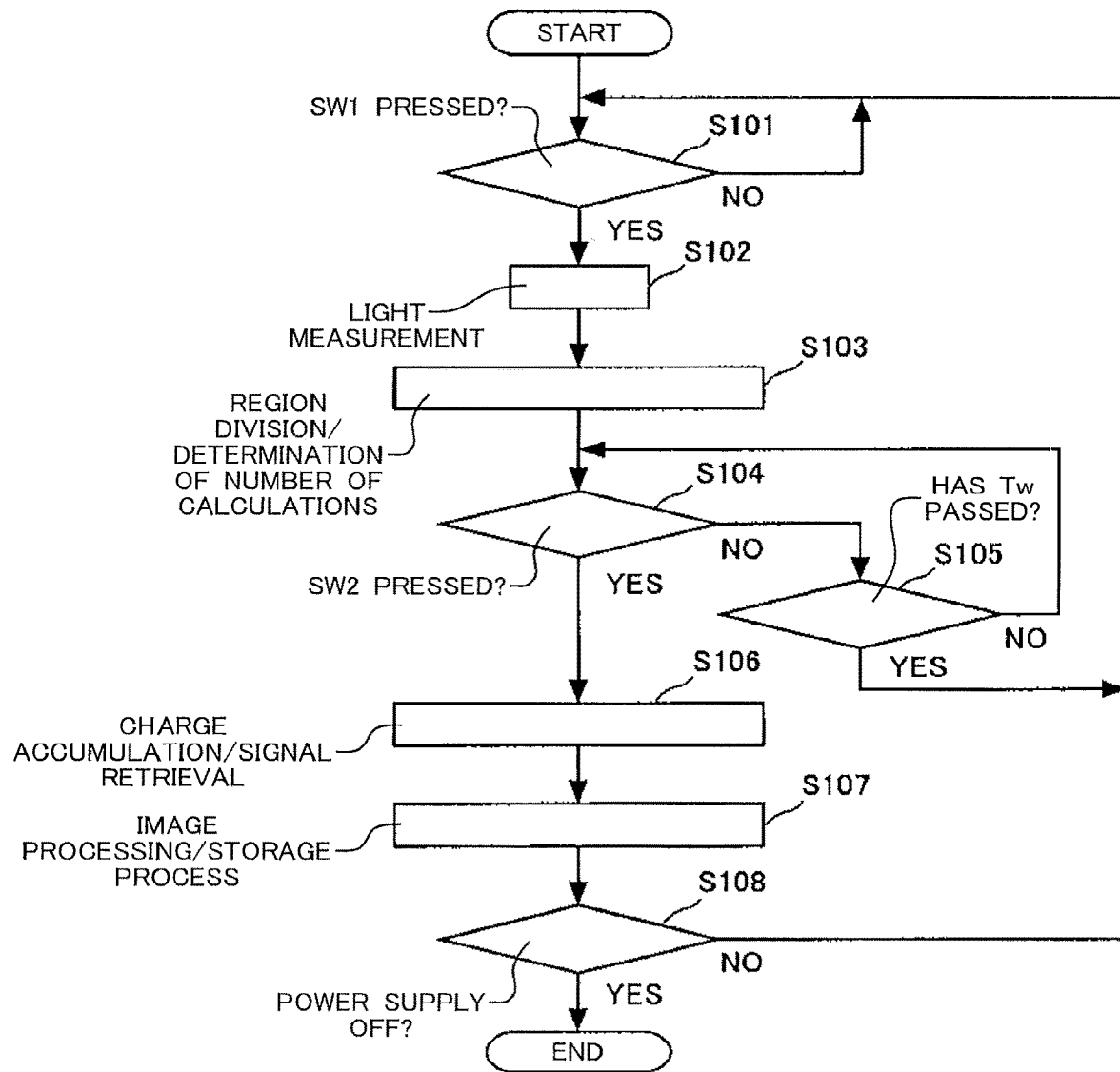
FIG. 9 is a flow showing processing of the image capturing operations.

The following describes a series of image capturing operations. FIG. 9 is a flow showing processing of the image capturing operations. This flow is begun by turning ON the power supply of the imaging apparatus 500.

At step S101, the system control section 501 stands by until the switch SW1 is pressed, which indicates the image capturing preparation instructions. When pressing of the switch SW1 is detected, the process moves to step S102.

At step S102, the system control section 501 performs a light measuring process. Specifically, the system control section 501 obtains the output of the photometric section 503, and the calculating section 512 calculates a brightness distribution of the scene. The process then moves to step S103, and the shutter speed, region division, number of integrations, and the like are calculated as described above.

When the image capturing preparation operation is finished, the process moves to step S104 and the standby state continues until the switch SW2 is pressed, which indicates the image capturing instructions. At this time, if a time longer than a predetermined time Tw has passed (the YES of step S105), the process returns to step S101. If pressing of the switch SW2 is detected before the time Tw has passed (the NO of step S105), then the process moves to step S106.

At step S106, the driving section 502 that has received the instructions of the system control section 501 performs the charge accumulation process and signal retrieval process described using FIG. 7. When retrieval of all of the signals has finished, the process moves to step S107, the image processing described using FIG. 8 is performed, and a recording process is performed to record the generated image data in the storage section.

When the recording process is finished, the process moves to step S108, and a judgment is made as to whether the power supply of the imaging apparatus 500 has been turned OFF. If the power supply has not been turned OFF the process returns to step S101, and if the power supply has been turned OFF, the image capturing operation process is finished.

Figure 10:
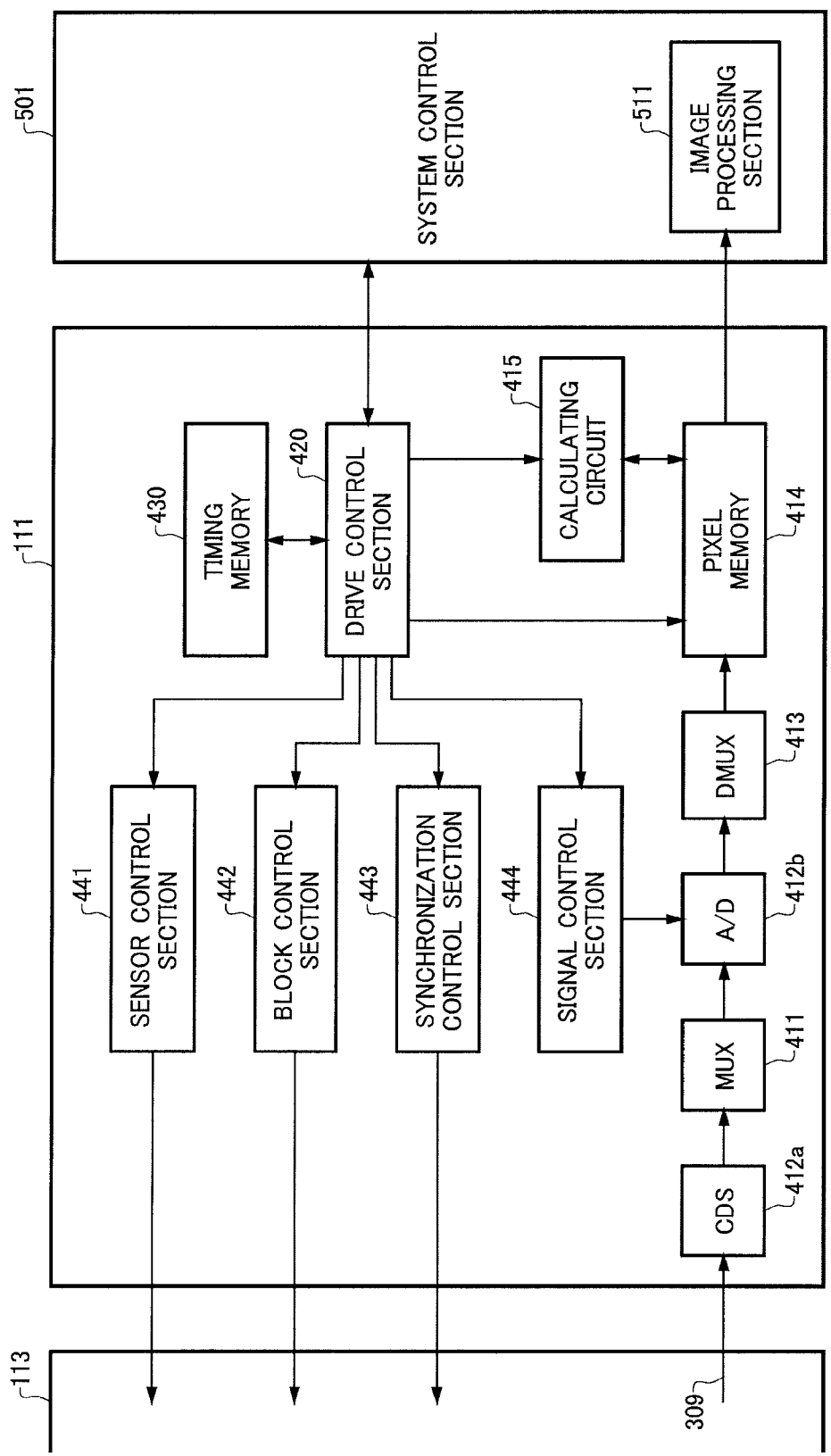
FIG. 10 is a block diagram showing a detailed configuration as an example of the signal processing chip.

The following describes an exemplary detailed configuration of the signal processing chip 111. FIG. 10 is a block diagram showing a detailed configuration as an example of the signal processing chip 111. In the description using FIG. 4, an example was used in which the de-multiplexer 413 and the pixel memories 414 are formed in the memory chip 112, but the following is an example in which these components are formed in the signal processing chip 111.

The signal processing chip 111 fulfills the function of the driving section 502. The signal processing chip 111 includes a sensor control section 441 to share the control function, a block control section 442, a synchronization control section 443, a signal control section 444, and a drive control section 420 that performs overall control of the control sections. The drive control section 420 converts the instructions from the system control section 501 into control signals that can be executed by each control section, and passes these control signals to the control sections.

The sensor control section 441 performs transmission control to transmit a control pulse relating to charge accumulation and charge retrieval of each pixel to the imaging chip 113. Specifically, the sensor control section 441 controls the start and end of the charge accumulation by transmitting the reset pulse and the transfer pulse to each pixel, and causes the pixel signals to be output to the output wire 309 by transmitting the selection pulse to the pixels to be retrieved.

The block control section 442 transmits, to the imaging chip 113, an identification pulse that identifies single groups 131 to be controlled. As described using FIG. 6 and the like, the divided regions include a plurality of single groups 131 that are adjacent to each other. The single groups 131 that are associated with the same region form one block. The pixels contained in the same block all begin the charge accumulation at the same timing and end the charge accumulation at the same timing. The block control section 442 performs the role of forming the single groups 131 in blocks, by transmitting the identification pulse to the single groups 131 that are targets based on the instructions from the drive control section 420. The transfer pulse and the reset pulse received by each pixel via the TX wire 307 and the reset wire 306 are the AND of respective pulses transmitted from the sensor control section 441 and the identification pulse transmitted by the block control section 442. In this way, by controlling the regions in blocks that are independent from each other, the charge accumulation control described using FIG. 7 is realized. The block instructions from the drive control section are described in detail further below.

The synchronization control section 443 transmits a synchronization signal to the imaging chip 113. Each pulse is synchronized with the synchronization signal and active in the imaging chip 113. For example, by adjusting the synchronization signal, random control, thinning control, and the like are realized targeting only the identified pixels among the pixels associated with the same single group 131.

The signal control section 444 mainly controls the timing for the A/D converter 412*b*. The pixel signals output via the output wire 309 pass through the CDS circuit 412*a* and the multiplexer 411 to be input to the A/D converter 412*b*. The A/D converter 412*b* converts the input pixel signals into digital signals, under the control of the signal control section 444. The pixel signals that have been converted into digital signals are handed over to the de-multiplexer 413, and stored as digital data pixel values in the pixel memories 414 corresponding respectively to the pixels.

The signal processing chip 111 includes a timing memory 430 that serves as an accumulation control memory and stores block classification information indicating which single groups 131 are combined to form blocks and accumulation number information indicating how many times each of the blocks has performed the charge accumulation. The timing memory 430 may be formed by a flash RAM, for example.

In the manner described above, the system control section 501 determines which of the single groups are to be combined to form the blocks, based on the detection results of the scene brightness distribution detection performed before the image capturing sequence. The determined blocks are classified as block 1, block 2, etc., for example, and are defined by which of the single groups 131 are included therein. The drive control section 420 receives the block classification information from the system control section 501, and stores this information in the timing memory 430.

The system control section 501 determines how many times each block performs charge accumulation, based on the detection results of the brightness distribution. The drive control section 420 receives the accumulation number information from the system control section 501, and stores this information in the timing memory 430 as a pair with the corresponding block classification information. By storing the block classification information and the accumulation number information in the timing memory 430 in this manner, the drive control section 420 can sequentially reference the timing memory 430 to independently perform the charge accumulation control. In other words, when an image capturing instruction signal is received form the system control section 501 while performing single image acquisition control, the drive control section 420 can finish the accumulation control without later receiving instructions from the system control section 501 concerning control for each pixel.

The drive control section 420 receives the updated block classification information and accumulation number information from the system control section 501 based on the light measurement result (brightness distribution detection result) performed in synchronization with the image capturing preparation instructions, and suitably updates the content stored in the timing memory 430. For example, the drive control section 420 updates the timing memory 430 in synchronization with the image capturing preparation instructions or the image capturing instructions. With this configuration, higher speed charge accumulation control can be realized, and the system control section 501 can perform other process in parallel while the drive control section 420 performs the charge accumulation control.

The drive control section 420 does not stop at performing the charge accumulation control for the imaging chip 113, and also references the timing memory 430 when performing retrieval control. For example, the drive control section 420 references the accumulation number information of each block, and stores the pixel signals output from the de-multiplexer 413 in the corresponding addresses of the pixel memories 414.

The drive control section 420 retrieves a target pixel signal from the pixel memory 414 according to a handover request from the system control section 501, and hands this pixel signal over to the image processing section 511. As described above, the pixel memory 414 includes a memory space capable of storing pixel signals corresponding to the maximum number of integrations for each pixel, and stores the pixel signals corresponding to the number of accumulations that have been performed as pixel values. For example, in a case where the charge accumulation is performed 4 times for a given block, since the pixels of this block output pixel signals corresponding to four charge accumulations, four pixel values are stored in the memory space for each pixel in the pixel memories 414. When a handover request that requests pixel signals of identified pixels is received from the system control section 501, the drive control section 420 designates the address of the identified pixel in the pixel memory 414, retrieves all of the stored pixel signals, and hands these pixel signals over to the image processing section 511. For example, in a case where four pixel values are stored, these four pixel values are sequentially handed over, and when only one pixel value is stored, this pixel value is handed over.

The drive control section 420 can retrieve the pixel signals stored in the pixel memories 414 to the calculating circuit 415, and cause the calculating circuit 415 to perform the integration process described above. The pixel signals that have undergone the integration process are stored in the target pixel addresses of the pixel memories 414. The target pixel addresses may be adjacent in the address space before the integration process, and may be the same addresses, such that the pixel signal before the integration process at each address is overwritten. Furthermore, there may be a specialized space for storing together the pixel values of the pixels after the integration process. When a handover request requesting pixel signals of identified pixels is received from the system control section 501, the drive control section 420 can hand over the pixel signals after the integration process to the image processing section 511, according to the specifics of the handover request. Of course, the pixel signals before and after the integration process can be handed over together.

The pixel memories 414 may be provided with a data transfer interface that transfers pixel signals according to the handover request. The data transfer interface is connected to a data transfer wire, which is connected to the image processing section 511. The data transfer wire is formed by a data bus on a bus line, for example. In this case, the handover request from the system control section 501 to the drive control section 420 is performed by an address designation using an address bus.

The transmission of the pixel signals by the data transfer interface is not limited to an address designation method, and a variety of methods can be adopted. For example, when performing a data transfer, a double data rate method can be used in which processing is performed using both the rising and falling edges of a clock signal used to synchronize the circuits. As another example, a burst transfer method can be used in which the data is transferred all at once by omitting a portion of the procedures, such as address designation, in order to achieve higher speed. As yet another example, combinations of different methods can be used, such as a combination of a bus method in which the control section, the memory section, and the input/output section are connected in parallel by wiring and a serial method in which data is transferred serially one bit at a time.

With this configuration, the image processing section 511 can receive only the necessary pixel signals, and therefore the image processing can be completed at high speed, especially in a case of forming an image with low resolution. Furthermore, when the calculating circuit 415 is performing the integration process, the image processing section 511 need not perform the integration process, and therefore the image processing can be made high speed, by sharing functions and performing parallel processing.

Figure 11:
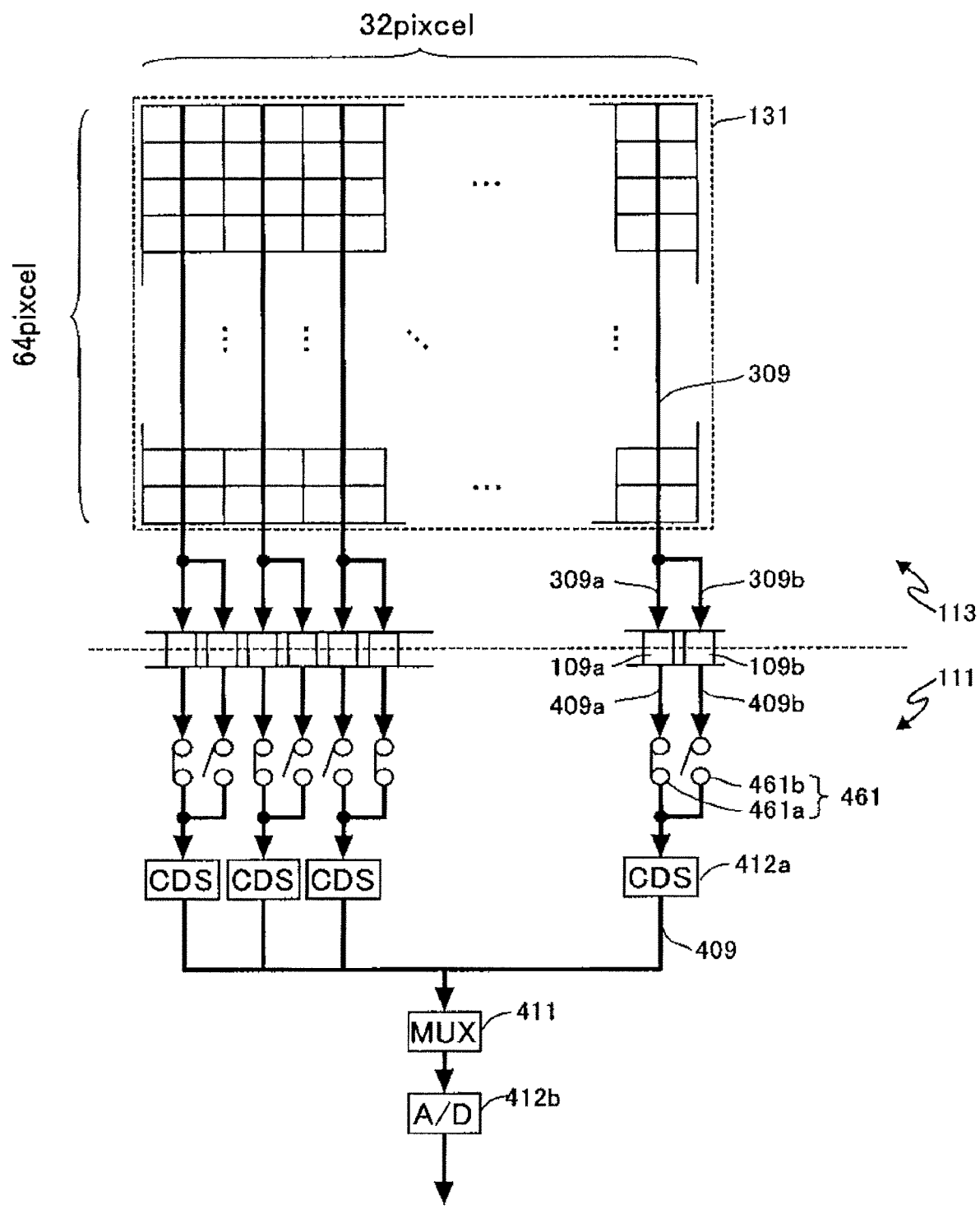
FIG. 11 is a view describing the flow of pixel signals from the imaging chip to the signal processing chip.

FIG. 11 is a view describing the flow of pixel signals from the imaging chip 113 to the signal processing chip 111. In this example, the single group 131 is formed by 2048 pixels arranged with 32 pixels in each row and 64 pixels in each column.

In the configuration shown in FIG. 3, one single group 131 has one output wire 309, but in the example of FIG. 11, one single group 131 has 16 output wires, such that one output wire 309 is shared by pixels in two adjacent rows. Each output wire 309 branches into two output wires 309a and 309b near the connection portion between the imaging chip 113 and the signal processing chip 111.

On the signal processing chip 111 side, two input wires 409a and 409b are provided corresponding respectively to the branched output wires 309a and 309b. Accordingly, at the connection portion, a bump 109a is provided to connect the output wire 309a and the input wire 409a, and a bump 109b is provided to connect the output wire 309b and the input wire 409b. By forming a redundant connection in this manner, the likelihood of pixel defects occurring due to connection problems can be decreased. In this sense, the number of branches is not limited to two, and there may be a plurality of branches. Furthermore, the electrical connection between the output wire and the input wire is not limited to a bump connection, and when adopting an electrical connection in which connection problems are possible, the connection section preferably has a redundant configuration such as described above.

The input wires 409a and 409b have switches 461a and 461b formed therein, before input to the CDS circuit 412a. The switches 461a and 461b are controlled by the drive control section 420 to move together as a switch 461. Specifically, the drive control section 420 usually activates transmission of pixel signals through the input wire 409a by turning ON the switch 461, and deactivates transmission on the input wire 409b by turning OFF the switch 461b. On the other hand, when it is determined that a connection problem has occurred in the bump 109a, the drive control section 420 switches OFF the switch 461a to deactivate the transmission of the input wire 409a, and switches ON the switch 461b to activate the transmission of the input wire 409b. In this way, according to the linked operation of the switch 461 that sets one wire to a connected state and another wire to a disconnected state, it can be expected that only correct pixel signals will be input to the CDS circuit 412a.

The determination concerning connection problems of the bumps 109 can be made by the drive control section 420, or can be made by the system control section 501. The connection problem determination is made based on the results of the output of pixel signals passed through the input wire 409. Specifically, the system control section 501 compares pixel signals output from output wires 309 adjacent on both ends, and when it is determined that there is a difference that is greater than or equal to a predetermined threshold value, determined that there is a connection problem. A determination standard concerning whether there are continuous abnormal values in the row direction may also be added. In this case, the drive control section 420 receives the determination result of the system control section 501 and switches the switch 461 of the corresponding input wire 409. The connection problem judgment may be combined with the image capturing operations and not performed sequentially, and when a judgment is made, the drive control section 420 can store the judgment result in the timing memory 430. In this case, the drive control section 420 controls the switch 461 while referencing the timing memory 430 when retrieving the pixel signals.

In the embodiments described above, the photometric section 503 includes an independent AE sensor. However, the light measurement process can be performed using a pre-image output from the imaging element 100 before the image capturing instructions are received from the user and the main image capturing process is performed. Furthermore, the pixels used for light measurement may be provided in one single group 131, for example. In the pixel arrangement of FIG. 2, for example, by setting the color filter of the pixel in the upper left corner of the single group 131 to be a transparent filter or not providing a filter, this pixel can be used as a light measurement pixel. Such a pixel can receive visible light over a wide bandwidth, and is therefore suitable for detecting the brightness distribution of a scene. Furthermore, the light measurement pixel may be independent from the single group, and light measurement pixels may be collected to form a new single group. With this configuration, the driving section 502 can independently control the charge accumulation for the light measurement pixels.

The above embodiments describe an example in which the determined exposure time T0 matches one charge accumulation time of the shadow region, but instead, there may be two charge accumulations performed for the shadow region during the determined exposure time T0, for example. In this case, using the example of FIG. 7, the shift of the brightness range providing a gradation sequence to the high brightness side according to the number of integrations, which is for pixel signals from the intermediate region for which the charge accumulation is performed twice, is not performed for the pixel signals from the shadow region. In other words, the value of a pixel signal resulting from one charge accumulation (charge accumulation time of T0/2) in the shadow region is low, and will not become saturated from a 12-bit range even if two charge accumulations are added, and therefore there is no need to perform the shift process.

In this way, if a plurality of charge accumulations are set for the shadow region and the adding process is performed for the output pixel signals, the randomization in the dark portions can be expected to be cancelled out. In this case, with the objective of enlarging the dynamic range, the shift process can be omitted and a simple adding process may be performed, unlike the processing of the pixel signals in other regions where the charge accumulation is performed a plurality of times. In the same manner as in the embodiments described above, this type of processing may be performed by the image processing section 511 or by the calculating circuit 415 provided in the signal processing chip 111.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

100: imaging element, 101: microlens, 102: color filter, 103: passivation film, 104: PD (Photo Diode), 105: transistor, 106: PD layer, 107: wire, 108: wiring layer, 109: bump, 110: TSV (Through Silicon Via), 111: signal processing chip, 112: memory chip, 113: imaging chip, 131: single group, 302: transfer transistor, 303: reset transistor, 304: amplification transistor, 305: selection transistor, 306: reset wire, 307: TX wire, 308: decoder wire, 309: output wire, 310: Vdd wire, 311: negative current source, 409: input wire, 411: multiplexer, 412: signal processing circuit, 413: demultiplexer, 414: pixel memory, 415: calculating circuit, 420: drive control section, 430: timing memory, 441: sensor control section, 442: block control section, 443: synchronization control section, 444: signal control section, 461: switch, 500: imaging apparatus, 501: system control section, 502: driving section, 503: photometric section, 504: work memory, 505: storage section, 506: display section, 511: image processing section, 512: calculating section, 601: shadowed subject, 602: intermediate subject, 603: highlighted subject, 604: frame, 611: shadow region, 612: intermediate region, 613: highlight region

What is claimed is:

1. An imaging sensor comprising:
a plurality of pixels arranged side-by-side in a row direction and a column direction;
a first control wire, through which a first control signal for controlling a first pixel among the plurality of pixels is output, that is connected to the first pixel;
a second control wire, through which a second control signal for controlling a second pixel among the plurality of pixels is output, that is connected to the second pixel, the second pixel arranged to a side of the first pixel in the row direction;
a first conversion section for converting a first signal retrieved from the first pixel into a digital signal; and
a second conversion section for converting a second signal retrieved from the second pixel into a digital signal.

2. The imaging sensor according to claim 1,
wherein
the first pixel includes a first photoelectric converting section that converts light into charge,
the second pixel includes a second photoelectric converting section that converts light into charge,
at least the first photoelectric converting section for the first pixel and at least the second photoelectric converting section for the second pixel are disposed on an imaging chip to which light is incident, and
at least some circuitry of the first conversion section and at least some circuitry of the second conversion section are disposed on a signal processing chip connected to the imaging chip.

3. The imaging sensor according to claim 2, further comprising
a first storing section that stores the first signal that has been converted into a digital signal by the first conversion section; and
a second storing section that stores the second signal that has been converted into a digital signal by the second conversion section.

4. The imaging sensor according to claim 3, wherein
at least some circuitry of the first storing section and at least some circuitry of the second storing section are disposed on a memory chip connected to the signal processing chip.

5. The imaging sensor according to claim 1, wherein
the first pixel includes
a first photoelectric converting section that converts light into charge, and
a first transfer section that transfers charge converted by the first photoelectric converting section, and that is connected to the first control wire, and
the second pixel includes
a second photoelectric converting section that converts light into charge, and
a second transfer section that transfers charge converted by the second photoelectric converting section, and that is connected to the second control wire, the first transfer section transfers charge of the first photoelectric converting section based on the first control signal outputted to the first control wire, and the second transfer section transfers charge of the second photoelectric converting section based on the second control signal outputted to the second control wire.

6. The imaging sensor according to claim 5, wherein at least the first photoelectric converting section for the first pixel and at least the second photoelectric converting section for the second pixel are disposed on an imaging chip to which light is incident, and at least some circuitry of the first conversion section and at least some circuitry of the second conversion section are disposed on a signal processing chip connected to the imaging chip.

7. The imaging sensor according to claim 6, further comprising a first storing section that stores the first signal that has been converted into a digital signal by the first conversion section; and a second storing section that stores the second signal that has been converted into a digital signal by the second conversion section.

8. The imaging sensor according to claim 7, wherein at least some circuitry of the first storing section and at least some circuitry of the second storing section are disposed on a memory chip connected to the signal processing chip.

9. The imaging sensor according to claim 1, wherein the first pixel includes a first photoelectric converting section that converts light into charge, a first floating diffusion to which charge of the first photoelectric converting section is transferred, and a first reset section that is connected to the first control wire, and that resets potential of the first floating diffusion, the second pixel includes a second photoelectric converting section that converts light into charge, a second floating diffusion to which charge of the second photoelectric converting section is transferred, and a second reset section that is connected to the second control wire, and that resets potential of the second floating diffusion, the first reset section resets potential of the first floating diffusion based on the first control signal, and the second reset section resets potential of the second floating diffusion based on the second control signal.

10. The imaging sensor according to claim 9, wherein at least the first photoelectric converting section for the first pixel and at least the second photoelectric converting section for the second pixel are disposed on an imaging chip to which light is incident, and at least some circuitry of the first conversion section and at least some circuitry of the second conversion section are disposed on a signal processing chip connected to the imaging chip.

11. The imaging sensor according to claim 10, further comprising a first storing section that stores the first signal that has been converted into a digital signal by the first conversion section; and a second storing section that stores the second signal that has been converted into a digital signal by the second conversion section.

12. The imaging sensor according to claim 11, wherein at least some circuitry of the first storing section and at least some circuitry of the second storing section are disposed on a memory chip connected to the signal processing chip.

13. The imaging sensor according to claim 1, further comprising a third control wire, through which a third control signal for controlling the first pixel is output, that is connected to the first pixel; and a fourth control wire, through which a fourth control signal for controlling the second pixel is output, that is connected to the second pixel.

14. The imaging sensor according to claim 13, wherein the first pixel includes a first photoelectric converting section that converts light into charge, a first transfer section that transfers charge converted by the first photoelectric converting section, and that is connected to the first control wire, a first floating diffusion to which charge of the first photoelectric converting section is transferred, and a first reset section that is connected to the third control wire, and that resets potential of the first floating diffusion, and the second pixel includes a second photoelectric converting section that converts light into charge, a second transfer section that transfers charge converted by the second photoelectric converting section, and that is connected to the second control wire, a second floating diffusion to which charge of the second photoelectric converting section is transferred, and a second reset section that is connected to the fourth control wire, and that resets potential of the second floating diffusion, wherein the first transfer section transfers charge of the first photoelectric converting section based on the first control signal, the second transfer section transfers charge of the second photoelectric converting section based on the second control signal, the first reset section resets potential of the first floating diffusion based on the third control signal, and the second reset section resets potential of the second floating diffusion based on the fourth control signal.

15. The imaging sensor according to claim 14, wherein at least the first photoelectric converting section for the first pixel and at least the second photoelectric converting section for the second pixel are disposed on an imaging chip to which light is incident, and at least some circuitry of the first conversion section and at least some circuitry of the second conversion section are disposed on a signal processing chip connected to the imaging chip.

16. The imaging sensor according to claim 15, further comprising a first storing section that stores the first signal that has been converted into a digital signal by the first conversion section; and a second storing section that stores the second signal that has been converted into a digital signal by the second conversion section.

17. The imaging sensor according to claim 16, wherein at least some circuitry of the first storing section and at least some circuitry of the second storing section are disposed on a memory chip connected to the signal processing chip.

18. An electronic device comprising:
the imaging sensor of claim 1; and
a control section that controls the imaging sensor.

19. The electronic device according to claim 18, wherein the control section controls a timing at which the first control signal is outputted to the first control wire and a timing at which the second control signal is outputted to the second control wire.

20. An electronic device comprising:
the imaging sensor of claim 14; and
a control section that controls the imaging sensor, wherein the control section controls a timing at which the first control signal is outputted to the first control wire, a timing at which the second control signal is outputted to the second control wire, a timing at which the third control signal is outputted to the third control wire, and a timing at which the fourth control signal is outputted to the fourth control wire.

* * * * *